(12) United States Patent
Hermanson et al.

(10) Patent No.: US 10,867,772 B2
(45) Date of Patent: Dec. 15, 2020

(54) ELECTROSTATIC ELEMENT HAVING GROOVED EXTERIOR SURFACE

(71) Applicant: Varian Semiconductor Equipment Associates, Inc., Gloucester, MA (US)

(72) Inventors: Eric Hermanson, Georgetown, MA (US); Philip Layne, Salem, MA (US); James Alan Pixley, Dover, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/485,519

(22) PCT Filed: Mar. 19, 2018

(86) PCT No.: PCT/US2018/023056
§ 371 (c)(1),
(2) Date: Aug. 13, 2019

(87) PCT Pub. No.: WO2018/175276
PCT Pub. Date: Sep. 27, 2018

(65) Prior Publication Data
US 2020/0020508 A1  Jan. 16, 2020

Related U.S. Application Data

(60) Provisional application No. 62/474,324, filed on Mar. 21, 2017.

(51) Int. Cl.
*H01J 37/31* (2006.01)
*H01J 37/12* (2006.01)
(Continued)

(52) U.S. Cl.
CPC ...... *H01J 37/3171* (2013.01); *H01J 37/3002* (2013.01); *H01J 2237/022* (2013.01)

(58) Field of Classification Search
CPC .. H01J 37/05; H01J 37/3171; H01J 2237/057; H01J 37/12; H01J 2237/053;
(Continued)

(56) References Cited

U.S. PATENT DOCUMENTS 6,534,775 B1  3/2003  Harrington et al.
7,928,381 B1 *  4/2011  Kelly .................. H01J 37/05
                                              250/305
(Continued)

OTHER PUBLICATIONS

International Search Report and Written Opinion dated Jun. 29, 2018 for PCT Application, PCT/US2018/023056 filed Mar. 19, 2018.

*Primary Examiner* — David A Vanore

(57) ABSTRACT

Provided herein are approaches for increasing surface area of a conductive beam optic by providing grooves or surface features thereon. In one approach, the conductive beam optic may be part of an electrostatic filter having a plurality of conductive beam optics disposed along an ion beam-line, wherein at least one conductive beam optic includes a plurality of grooves formed in an exterior surface. In some approaches, a power supply may be provided in communication with the plurality of conductive beam optics, wherein the power supply is configured to supply a voltage and a current to the plurality of conductive beam optics. The plurality of grooves may be provided in a spiral pattern along a length of the conductive beam optic, and/or oriented parallel to a lengthwise axis of the conductive beam optic.

13 Claims, 8 Drawing Sheets

(51) Int. Cl.
*H01J 37/05* (2006.01)
*H01J 37/317* (2006.01)
*H01J 37/30* (2006.01)

(58) Field of Classification Search
CPC ... H01J 2237/24485; H01J 2237/24585; H01J 2237/303; H01J 37/3002; H01J 37/3178; H01J 37/32862; H01J 37/32889
USPC ............ 250/283, 292, 305, 310, 397, 396 R
See application file for complete search history.

(56) References Cited

U.S. PATENT DOCUMENTS

| | | | |
|---|---|---|---|
| 2008/0083617 A1* | 4/2008 | Simpson | A61B 5/14865 204/403.1 |
| 2009/0267001 A1 | 10/2009 | Huang | |
| 2013/0181139 A1 | 7/2013 | Eisner et al. | |
| 2015/0097115 A1* | 4/2015 | Schwartz | H01J 49/424 250/283 |
| 2016/0365225 A1 | 12/2016 | Anglin et al. | |
| 2017/0032924 A1* | 2/2017 | Lee | H01J 37/3171 |
| 2017/0092473 A1* | 3/2017 | Lee | H01J 37/32889 |
| 2020/0020508 A1* | 1/2020 | Hermanson | H01J 37/3171 |

\* cited by examiner

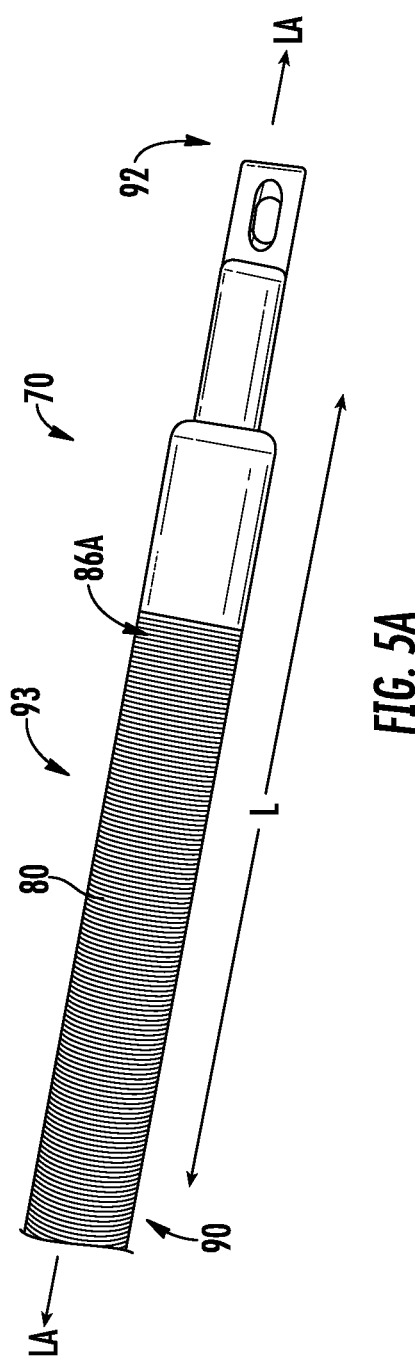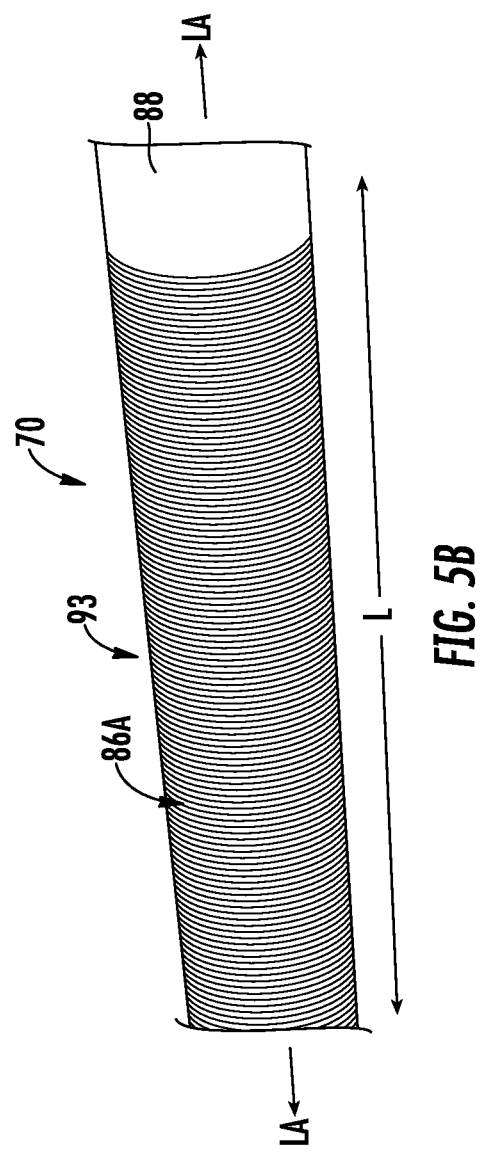
FIG. 5A
FIG. 5B

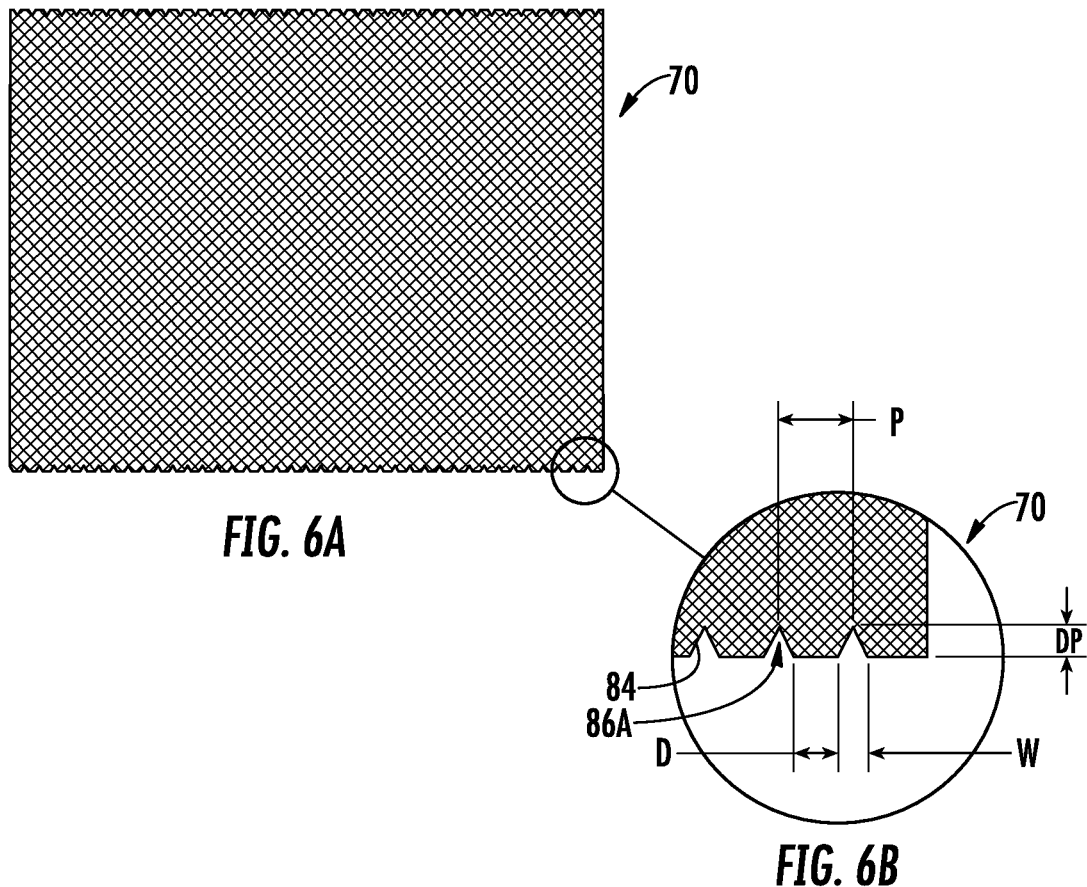
FIG. 6A
FIG. 6B
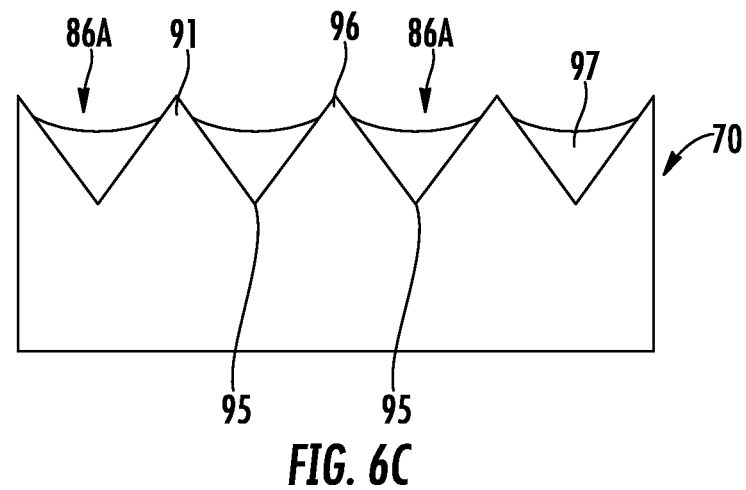
FIG. 6C

ELECTROSTATIC ELEMENT HAVING GROOVED EXTERIOR SURFACE

CROSS-REFERENCE TO RELATED APPLICATION

This application claims priority to U.S. Provisional Patent Application No. 62/474,324 filed Mar. 21, 2017, entitled "Electrostatic Element Having Grooved Exterior Surface," and incorporated by reference herein in its entirety.

FIELD OF THE DISCLOSURE

The disclosure relates generally to electrostatic elements, and more particularly, to techniques for improving the performance and extending the lifetime of electrostatic elements within a beamline and/or processing chamber.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile provides improved IC performance. To achieve a particular doping profile, one or more dopants may be implanted in the form of ions in various doses and various energy levels.

Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

The ion implanter system generates a stable, well-defined ion beam for a variety of different ion species and extraction voltages. After several hours of operation using source gases (such as $AsH_3$, $PH_3$, $BF_3$, and other species), beam constituents eventually create deposits on beam optics. Beam optics within a line-of-sight of the wafer also become coated with residues from the wafer, including Si and photoresist compounds. These residues build up on the beam-line components, causing spikes in the DC potentials during operation (e.g., in the case of electrically biased components). Eventually the residues flake off, causing an increased likelihood of particulate contamination on the wafer.

One way to prevent the effect of the particulate contamination is to intermittently replace beam-line components of the ion implanter system. Alternatively, beam-line components may be manually cleaned. Yet, manually cleaning entails powering down the ion source, and releasing the vacuum within the system. After replacing or cleaning the beam-line components, the system is then evacuated and powered to reach an operational condition. Accordingly, these maintenance processes may be very time consuming. In addition, the beam-line component is not used during the maintenance processes. As such, frequent maintenance processes may decrease the time available for IC production, thus increasing overall manufacturing cost.

BRIEF DESCRIPTION OF THE DRAWINGS

By way of example, specific embodiments of the disclosed device will now be described, with reference to the accompanying drawings, where:

FIGS. 5A-B are side perspective views of a conductive beam optic of the electrostatic filter of FIG. 2 in accordance with embodiments of the present disclosure.

FIGS. 6A-C are side cutaway views of a conductive beam optic of the electrostatic filter of FIG. 6 in accordance with embodiments of the present disclosure.

Figure 1:
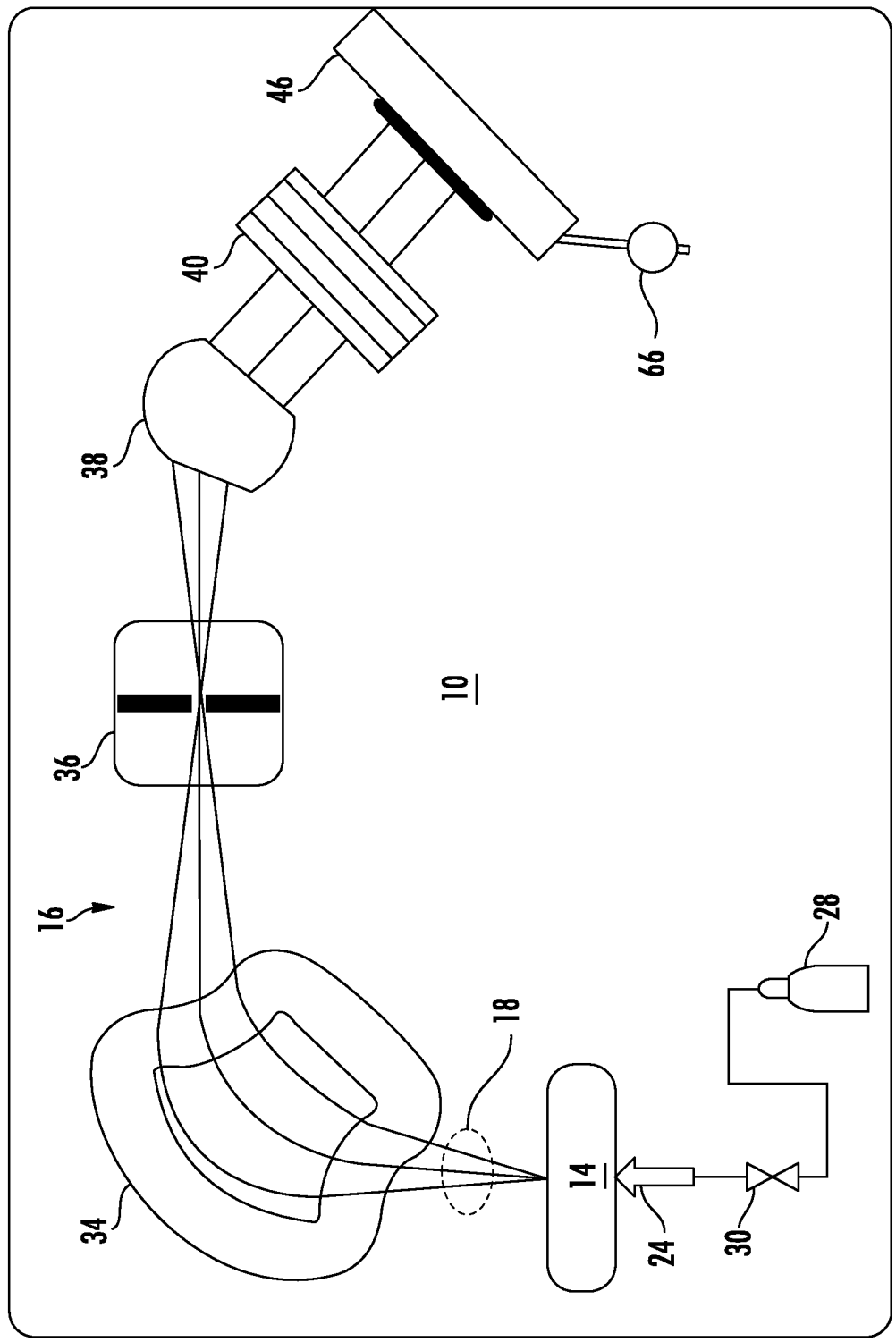
FIG. 1 is a schematic view illustrating an ion implantation system in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

In view of the foregoing deficiencies identified with the prior art, provided herein are systems and methods for increasing surface area of a conductive beam optic by providing grooves or surface features therein. In one approach, the conductive beam optic may be part of an electrostatic filter having a plurality of conductive beam optics disposed along an ion beam-line, wherein at least one conductive beam optic includes a plurality of grooves formed in an exterior surface. In some approaches, a power supply may be provided in communication with the plurality of conductive beam optics, wherein the power supply is configured to supply a voltage and a current to the plurality of conductive beam optics. The plurality of grooves may be provided in a spiral pattern along a length of the conductive beam optic, and/or oriented parallel to a lengthwise axis of the conductive beam optic.

An exemplary ion implantation system in accordance with embodiments of the disclosure may include an electrostatic filter (EF) within a chamber of the ion implantation system, the EF including a conductive beam optic having a plurality of grooves formed in an exterior surface. The ion implantation system may further include a power supply in communication with the EF, the power supply configured to supply a voltage and a current to the conductive beam optic.

An electrostatic filter in accordance with the present disclosure may include a plurality of conductive beam optics disposed along an ion beam-line, wherein at least one conductive beam optic of the plurality of conductive beam optics includes a plurality of grooves formed in an exterior surface, and a power supply in communication with the plurality of conductive beam optics, wherein the power supply is configured to supply a voltage and a current to the plurality of conductive beam optics.

An exemplary method in accordance with the present disclosure may include providing an electrostatic filter (EF) within a chamber of the ion implantation system, wherein the EF includes a plurality of conductive beam optics, and wherein at least one of the plurality of conductive beam optics has a plurality of grooves formed in an exterior surface. The method may further include coupling a power supply to the EF, the power supply configured to supply a voltage and a current to the plurality of conductive beam optics.

As stated above, approaches herein recognize the influence one or more geometric features, patterns, grooves (e.g., cross-sectional shapes or surface features) have on particle accumulation and plasma generation. More specifically, surface regions with non-smooth, strategically varied geometric features cause contamination to be concentrated and contained in certain areas.

Referring now to FIG. 1, an exemplary embodiment of an ion implantation system in accordance with the present disclosure is shown. The ion implantation system (hereinafter "system") 10 represents a process chamber containing, among other components, an ion source 14 for producing an ion beam 18, an ion implanter, and a series of beam-line components. The ion source 14 may comprise a chamber for receiving a flow of gas 24 and generates ions. The ion source 14 may also comprise a power source and an extraction electrode assembly disposed near the chamber. The beam-line components 16 may include, for example, a mass analyzer 34, a first acceleration or deceleration stage 36, a collimator 38, and an energy purity module (EPM) 40 corresponding to a second acceleration or deceleration stage. Although described hereinafter with respect to the EPM 40 of the beam-line components 16 for the sake of explanation, the embodiments described herein are also applicable to different/additional components of the system 10.

In exemplary embodiments, the beam-line components 16 may filter, focus, and manipulate ions or the ion beam 18 to have a particular species, shape, energy, and/or other qualities. The ion beam 18 passing through the beam-line components 16 may be directed toward a substrate mounted on a platen or clamp within a process chamber 46. The substrate may be moved in one or more dimensions (e.g., translate, rotate, and tilt).

As shown, there may be one or more feed sources 28 operable with the chamber of the ion source 14. In some embodiments, material provided from the feed source 28 may include source material and/or additional material. The source material may contain dopant species introduced into the substrate in the form of ions. Meanwhile, the additional material may include diluent, introduced into the ion source chamber of the ion source 14 along with the source material to dilute the concentration of the source material in the chamber of the ion source 14. The additional material may also include a cleaning agent (e.g., an etchant gas) introduced into the chamber of the ion source 14 and transported within the system 10 to clean one or more of the beam-line components 16.

In various embodiments, different species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

In exemplary embodiments, the source and/or additional material is provided into the ion source chamber of the ion source 14 in gaseous or vapor form. If the source and/or additional material is in non-gaseous or non-vapor form, a vaporizer (not shown) may be provided near the feed source 28 to convert the material into gaseous or vapor form. To control the amount and the rate the source and/or the additional material is provided into the system 10, a flowrate controller 30 may be provided.

The EPM 40 is a beam-line component configured to independently control deflection, deceleration, and focus of the ion beam 18. In one embodiment, the EPM 40 is a vertical electrostatic energy filter (VEEF) or electrostatic filter (EF). In other embodiments, the EPM 40 is an electrostatic lens of a dual magnet ribbon beam high current ion implanter. As will be described in greater detail below, the EPM 40 may include an electrode configuration comprising a set of upper electrodes disposed above the ion beam 18 and a set of lower electrodes disposed below the ion beam 18. The set of upper electrodes and the set of lower electrodes may be stationary and have fixed positions. A difference in potentials between the set of upper electrodes and the set of lower electrodes may also be varied along the ion beam trajectory to reflect an energy of the ion beam at various point along the ion beam trajectory for independently controlling deflection, deceleration, and/or focus of an ion beam.

During normal operation, some of the ions traversing through the EPM 40 exchange charge with background neutrals. These may be neutrals of the residual gas in the tool, for example nitrogen and water, or neutral products evolving off a wafer during ion implant. These products can be varied in composition, and thus allow for complicated chemical interactions. During the charge exchange process, the formerly neutral atoms become charged and accelerate towards the negatively biased electrodes in the EPM 40 as "slow" ions resulting in surface contamination on the electrodes. Controlling and/or containing surface contamination on the electrodes of the EPM 40 until electrode change or cleaning is an advantage provided by embodiments of the present disclosure, as will be described in further detail below.

Figure 2:
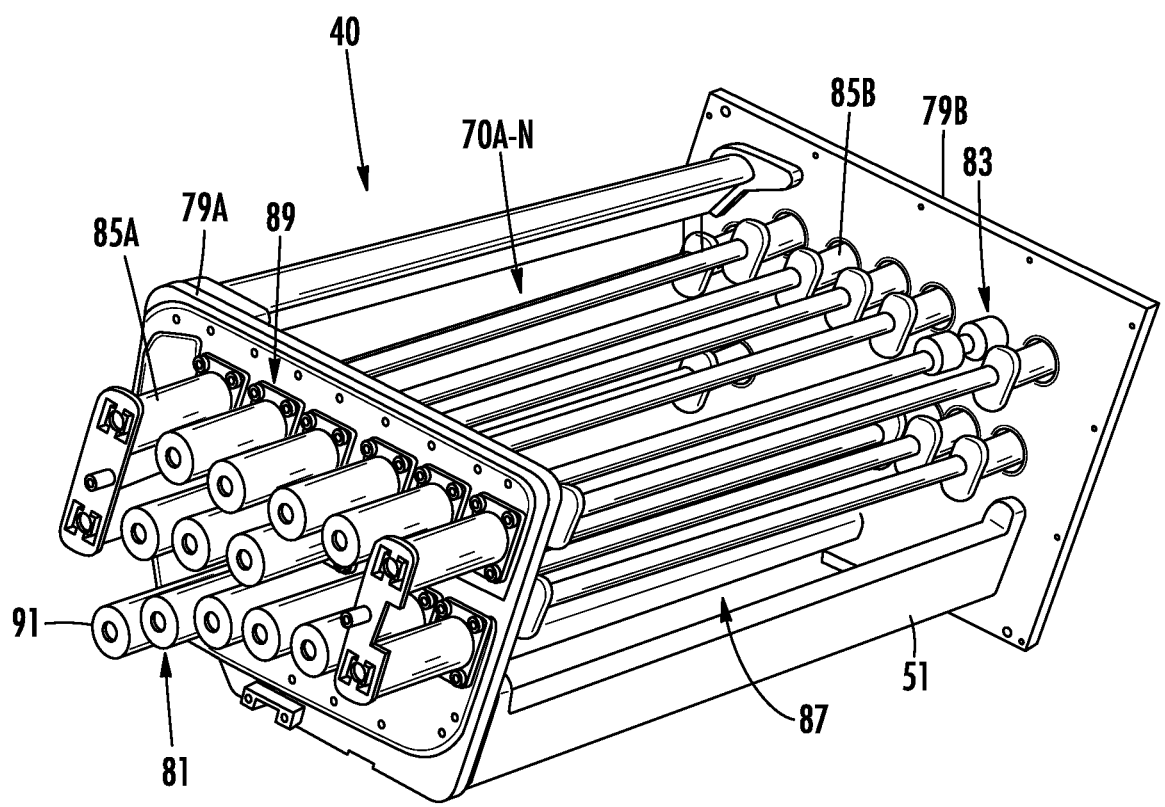
FIG. 2 is an isometric view illustrating an electrostatic filter in accordance with embodiments of the present disclosure.

Referring now to FIG. 2, the EPM 40 according to exemplary embodiments will be described in greater detail. As demonstrated, the EPM 40 may include a frame 51 having a set of opposing sidewalls 79A-B defining an interior area 87 housing the plurality of conductive beam optics 70A-N. The EPM 40 further includes multiple feedthrough components 81 extending through openings 83 of each of the opposing sidewalls 79A-B. The feedthrough components 81 each include a first section 85A disposed external to the interior area 87 defined by the opposing sidewalls 79A-B, and a second section 85B disposed within the interior area 87. The feedthrough components 81 may be coupled to the sidewalls 79A-B via a set of feedthrough fasteners 89. In non-limiting embodiments, the feedthrough components 81 may be female feedthrough connectors each including a receptacle 91 for enabling electrical connections.

In some embodiments, the EPM 40 may operate with one or more vacuum pumps 66 (FIG. 1) to adjust a pressure of the EPM 40. In exemplary embodiments, the vacuum pump 66 is coupled to the process chamber 46, and pressure is adjusted within the EPM 40 through one or more flow paths.

Figure 3:
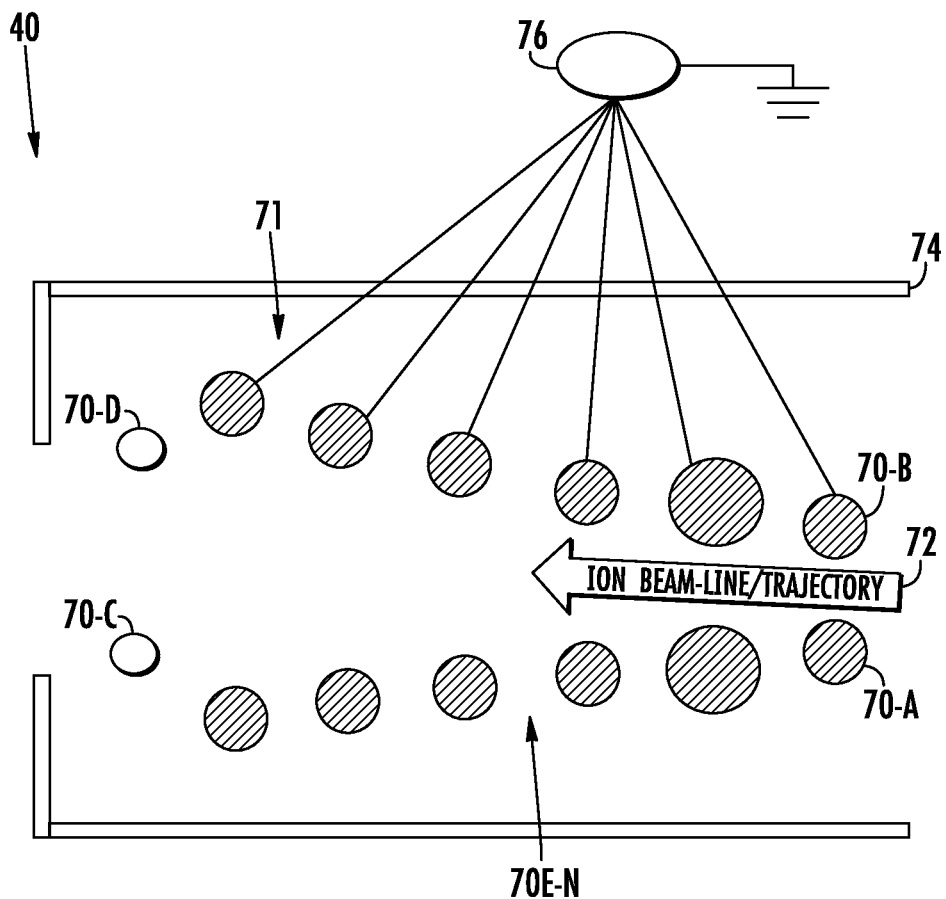
FIG. 3 is a side cross-sectional view illustrating the electrostatic filter of FIG. 2 in accordance with embodiments of the present disclosure.

As demonstrated in FIG. 3, the EPM 40 may include one or more conductive beam optics 70A-N, such as a plurality of graphite electrode rods disposed along an ion beam-line/trajectory 72, as shown. In this embodiment, the conductive beam optics 70A-N are arranged in a symmetrical configuration, wherein the conductive beam optics 70A-B represent a set of entrance electrodes, the conductive beam optics 70C-D represent a set of exit electrodes, and the remaining beam optics 70E-N represent several sets of suppression/focusing electrodes. As shown, each set of electrode pairs provides a space/opening to allow the ion beam (e.g., a ribbon beam) to pass therethrough along the ion beam-line/trajectory 72. In exemplary embodiments, the conductive beam optics 70A-N are provided in a housing 74. As described above, the vacuum pump 66 may be directly or indirectly connected to the housing 74 for adjusting a pressure of an environment 71 therein.

In exemplary embodiments, the conductive beam optics 70A-N include pairs of conductive pieces electrically coupled to one another. Alternatively, the conductive beam optics 70A-N may be a series of unitary structures each including an aperture for the ion beam to pass therethrough. In the embodiment shown, upper and lower portions of each electrode pair may have different potentials (e.g., in separate conductive pieces) in order to deflect the ion beam passing therethrough. Although the conductive beam optics 70A-N are depicted as seven (7) pairs (e.g., with five (5) sets of suppression/focusing electrodes), a different number of elements (or electrodes) may be utilized. For example, the configuration of conductive beam optics 70A-N may utilize a range of three (3) to ten (10) electrode sets.

In some embodiments, the ion beam passing through the electrodes along the ion beam-line 72 may include boron or other elements. Electrostatic focusing of the ion beam may be achieved by using several thin electrodes (e.g., the suppression/focusing electrodes of conductive beam optics 70E-N) to control grading of potential along the ion beam-line 72. In the configuration of conductive beam optics 70A-N shown, high deceleration ratios may also be provided. As a result, use of input ion beams may be used in an energy range to enable higher quality beams, even for very low energy output beams. In one non-limiting example, as the ion beam passes through the electrodes of the conductive beam optics 70A-N, the ion beam may be decelerated from 6 keV to 0.2 keV and deflected at 15°. In this non-limiting example, the energy ratio may be 30/1.

During a processing mode, a power supply 76 (e.g., a DC power supply) supplies a first voltage and a first current to the EPM 40. The voltage/current is supplied to conductive beam optics 70A-N to generate an electrostatic field within the EPM 40 (FIG. 2). In various embodiments, the voltage and current provided by the power supply 76 may be constant or varied. In one embodiment, the conductive beam optics 70A-N are held at a series of DC potentials from ground (0.0 kV)—65 kV.

During operation, formation of the layer of surface contamination may be non-uniform between beam optics, and/or non-uniform in different areas along an exterior surface of each individual beam optic 70A-N. For example, contamination may extend around the entire perimeter of conductive beam optics 70A and 70B, while a layer of surface contamination along the conductive beam optics 70C-E may be formed more prominently on a downstream side relative to the flow of the beam-line 72. Therefore, to increase localization of the contamination along the conductive beam optics 70A-N, one or more of the conductive beam optics (e.g., conductive beam optics 70C-E) may have a varied geometry and/or surface features, such as a plurality of exterior grooves, to facilitate material build up by increasing the surface area thereof.

Figure 4:
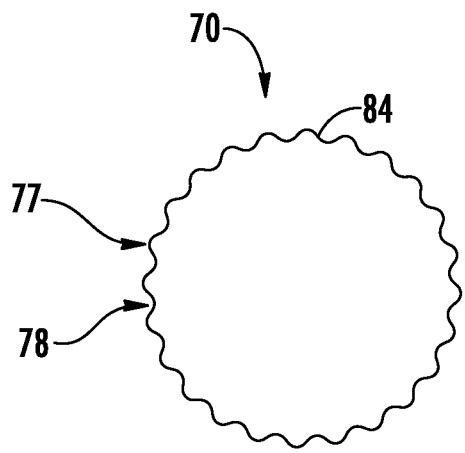
FIG. 4 is an end cross-sectional view of a conductive beam optic of the electrostatic filter of FIG. 2 having a plurality of grooves in accordance with embodiments of the present disclosure.

For example, as shown in FIG. 4, an exemplary conductive beam optic 70 may be a beam-line electrostatic element having one or more optic shapes with surfaces containing multiple radii of curvature and/or optic shapes having a combination of concave and convex surfaces. In some embodiments, the beam-line electrostatic element may be an electrode rod having one or more geometric features, including, although not limited to, a plurality of ridges 77 and indentations 78. The ridges and indentations 78 define one or more sidewalls 84. By recognizing surface contamination patterns within the EPM 40, the shape of the conductive beam optic 70 can be strategically selected, thus optimizing concentration and retainment of contamination thereon.

Figure 7:
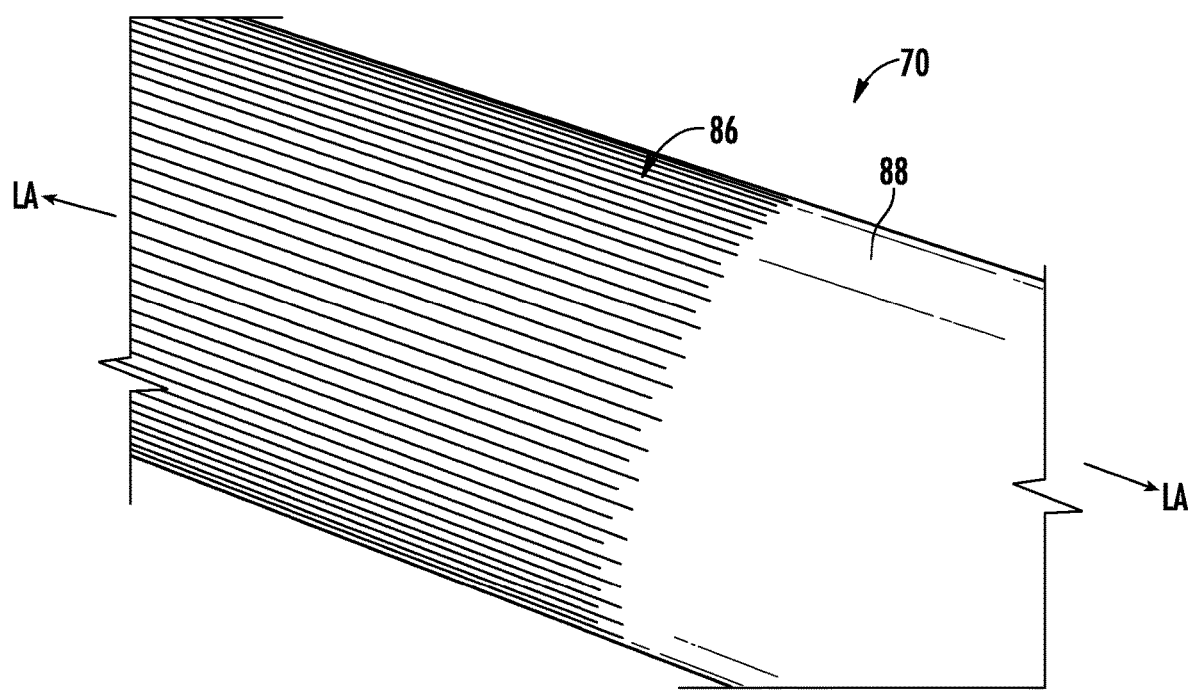
FIG. 7 is a side perspective view of a conductive beam optic of the electrostatic filter of FIG. 2 in accordance with embodiments of the present disclosure.

FIGS. 5A-B demonstrate exemplary surface features in the form of indentations or grooves 86 provided in an exterior surface 88 of the conductive beam optic 70. Mechanical or other means may be used to create either a spiral groove, lateral/axial groves, and/or random patterns of different dimensions into the graphite rod face. More specifically, the conductive beam optic 70 includes a first axial end 90 opposite a second axial end 92, and a central section 93 extending between the first and second axial ends 90, 92. The plurality of grooves 86 may be formed in the exterior surface 88 of the central section 93, as the central section 93 is more likely to receive contamination within the EPM 40. In some embodiments, as demonstrated in FIGS. 5A-6B, the plurality of grooves 86A are arranged in a spiral pattern along a length 'L' of the conductive beam optic 70. As shown, the spiral pattern grooves 86A may extend circumferentially around the exterior surface 88, for example, in a continuous helical loop or swirl pattern. The spiral pattern of grooves 86A may include approximately 5 to 50 distinct ridges and indentations, per inch, along the central section 93. In other embodiments, as demonstrated in FIG. 7, the plurality of grooves 86B may be oriented parallel, or approximately parallel, to a lengthwise axis 'LA' of the conductive beam optic 70. The grooves 86B continue circumferentially around the exterior surface 88 of the conductive beam optic 70. The lateral pattern of grooves 86B may include approximately 5 to 50 distinct ridges and indentations, per inch, along the central section 93.

In some embodiments, the plurality of grooves 86A-B are uniformly spaced apart from one another, and may extend to a uniform depth. For example, in the non-limiting embodiment of FIG. 6B, each of the grooves 86A may be spaced apart by a pitch 'P' of approximately 0.025 inches, a distance 'D' of approximately 0.015 inches, and extend to a uniform depth 'DP' of approximately 0.010 inches. Furthermore, each of the grooves 86A may have a width 'W' at the exterior surface 88 of approximately 0.010 inches. In other embodiments, the plurality of grooves 86A-B may be non-uniformly spaced apart from one another, and/or may extend to different depths. As further shown, each of the sidewalls 84 of the grooves 86A may be sloped or angled with respect to the lengthwise axis 'LA' of the conductive beam optic 70.

As shown in FIG. 6C, the grooves 86A of the conductive beam optic 70 may define a pointed notch. In some embodiments, the grooves 86A may be generally v-shaped. Said another way, the plurality of grooves 86A may be defined by a series of alternating peaks 95 and valleys 96. In other embodiments, the grooves 86A may define a trench having a flat bottom surface, i.e., a surface approximately parallel to the lengthwise axis LA, and a set of parallel sidewalls perpendicular to the flat bottom surface. As shown, each of the grooves 86A may define a cavity or recessed area operable to retain material 97 therein. The geometry and the additional surface area and of the grooves 86A provide for a longer rod life as more material 97 can build up and stay attached until the cleaning cycle is initiated.

Figure 8A:
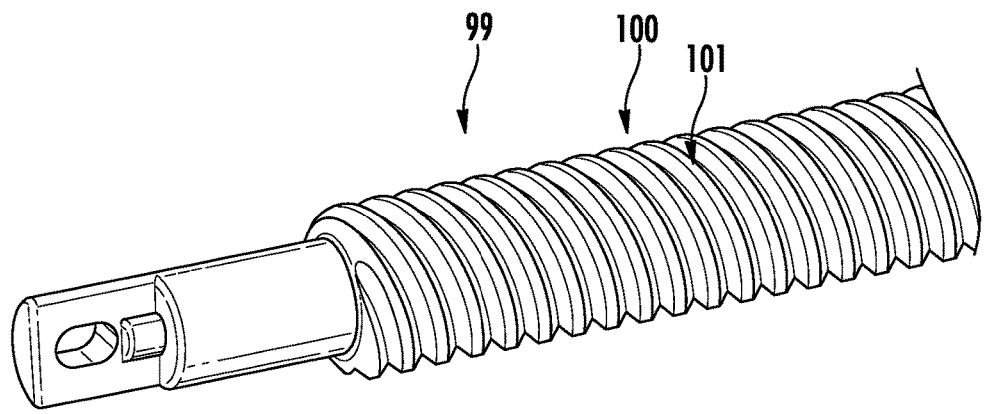
FIGS. 8A-C are side perspective views of various conductive beam optics in accordance with embodiments of the present disclosure.
Figure 8B:
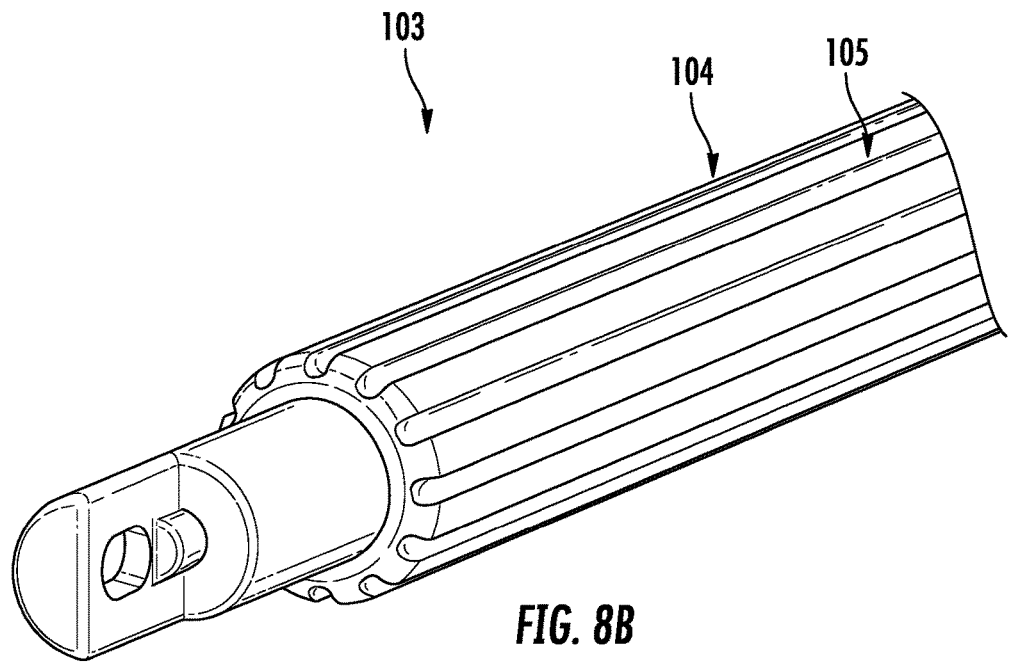
Figure 8C:
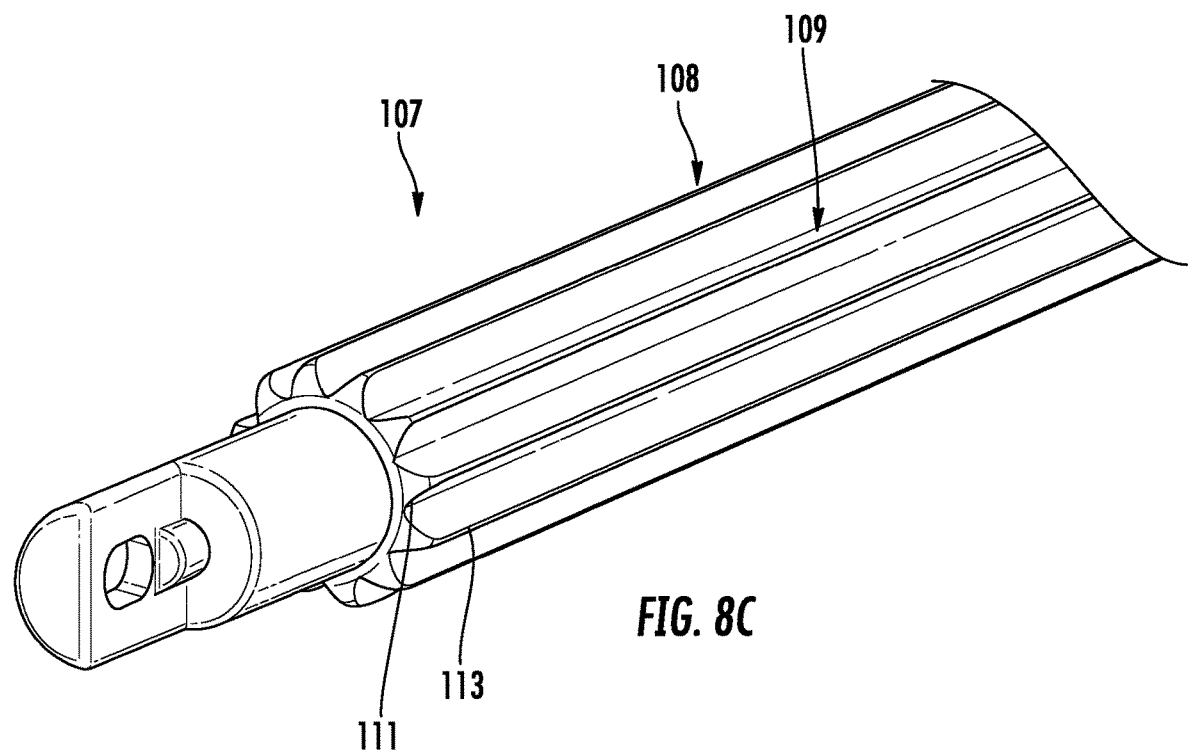

Turning now to FIGS. 8A-8C, a plurality of alternative conductive beam optics according to embodiments of the present disclosure will be described in greater detail. As shown in FIG. 8A, an electrode rod 99 may include a central section 100 having a plurality of spiral grooves 101 formed in an exterior surface thereof. The plurality of spiral grooves 101 may extend helically along an axial length of the electrode rod 99. As shown in FIG. 8B, an electrode rod 103 may include a central section 104 having a plurality of axial or lengthwise grooves 105 formed in an exterior surface thereof. The plurality of lengthwise grooves 105 may extend parallelly to one another, along an axial length of the electrode rod 103. The lengthwise grooves 105 may define a trench having a flat bottom surface, i.e., a surface approximately parallel to a lengthwise axis of the central section 104, and a set of parallel sidewalls perpendicular to the flat bottom surface.

As shown in FIG. 8C, an electrode rod 107 may include a central section 108 having a plurality of axial or lengthwise grooves 109 formed in an exterior surface thereof. The plurality of lengthwise grooves 109 may extend parallel to one another along an axial length of the electrode rod 107. As shown, each of the lengthwise grooves 109 may be defined by alternating valleys 111 and peaks 113. The peaks 113 may extend radially outward from the central section 108 and form a point or crest.

Figure 9:
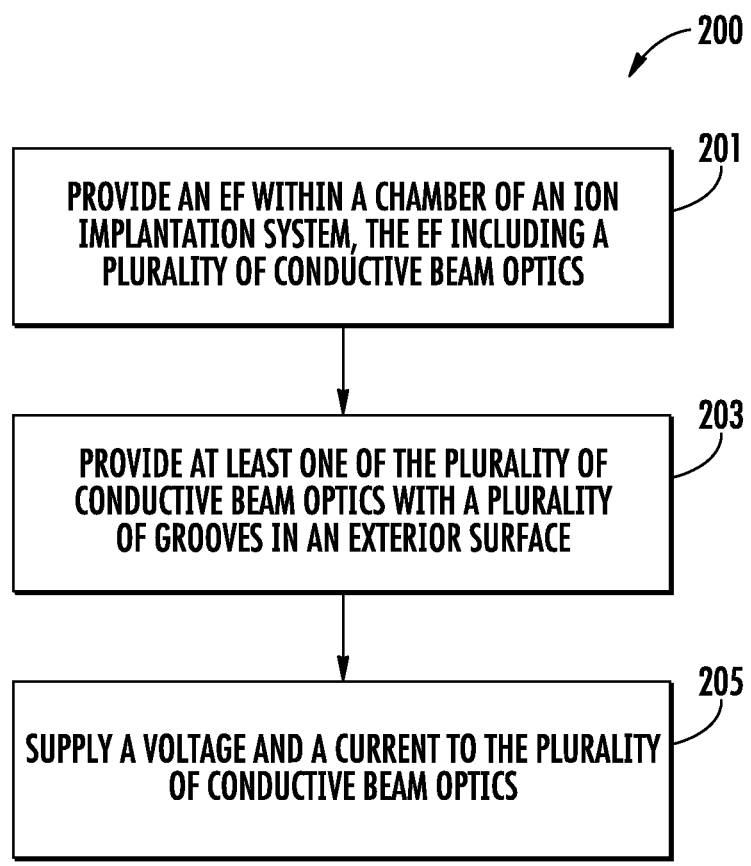
FIG. 9 is a flowchart illustrating an exemplary method in accordance with embodiments of the present disclosure.

Referring now to FIG. 9, a flow diagram illustrating an exemplary method 200 in accordance with the present disclosure is shown. The method 200 will be described in conjunction with the representations shown in FIGS. 1-8C.

Method 200 includes providing an electrostatic filter (EF) within a chamber of the ion implantation system, wherein the EF includes a plurality of conductive beam optics, as shown at block 201. In some embodiments, the conductive beam optics are disposed above and below a beamline. In some embodiments, the EF is an electrostatic lens.

The method 200 may further include providing at least one of the plurality of conductive beam optics with a plurality of grooves in an exterior surface thereof, as shown at block 203. In some embodiments, each of the plurality of grooves extends into the conductive beam optic to a uniform depth. In some embodiments, the plurality of grooves are provided in a spiral pattern along a length of the conductive beam optic. In some embodiments, the plurality of grooves are oriented parallel to a lengthwise axis of the conductive beam optic. In some embodiments, the plurality of grooves are equally spaced apart from one another.

The method 200 may further include supplying a voltage and a current to the plurality of conductive beam optics, as shown at block 205. In some embodiments, a power supply is coupled to the EF to provide the voltage and the current to each of the plurality of conductive beam optics. In some embodiments, the method includes supplying the voltage and the current to the EF during a processing mode.

In view of the foregoing, at least the following advantages are achieved by the embodiments disclosed herein. Firstly, contamination reaching the wafer is minimized, thus leading to increased production quality. Secondly, the additional surface area and irregularities provide for a longer rod life as more material can build up and stay attached to the surface for a longer period of time.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An ion implantation system, comprising:
   an electrostatic filter (EF) within a chamber of the ion implantation system, the EF including a conductive beam optic having a plurality of grooves formed in an exterior surface, wherein the plurality of grooves is arranged in a helical pattern along a length of the conductive beam optic; and
   a power supply in communication with the EF, the power supply configured to supply a voltage and a current to the conductive beam optic.

2. The ion implantation system of claim 1, the power supply configured to supply the voltage and the current to the conductive beam optic during a processing mode.

3. The ion implantation system of claim 1, wherein each of the plurality of grooves extends into the conductive beam optic to a uniform depth.

4. The ion implantation system of claim 1, wherein each of the plurality of grooves is approximately v-shaped.

5. The ion implantation system of claim 1, wherein the plurality of grooves are uniformly spaced apart from one another.

6. The ion implantation system of claim 1, further comprising a plurality of conductive beam optics.

7. A method comprising:
providing an electrostatic filter (EF) within a chamber of an ion implantation system, wherein the EF includes a plurality of conductive beam optics, and wherein at least one of the plurality of conductive beam optics has a plurality of grooves formed in an exterior surface, and wherein the plurality of grooves is arranged in a spiral pattern along a length of the at least one of the plurality of conductive beam optics; and
coupling a power supply to the EF, the power supply configured to supply a voltage and a current to the plurality of conductive beam optics.

8. The method of claim 7, further comprising supplying the voltage and the current to the EF during a processing mode.

9. The method of claim 7, wherein each of the plurality of grooves extends into the at least one of the plurality of conductive beam optics to a uniform depth.

10. The method of claim 7, wherein each of the plurality of grooves is formed into a V-shape.

11. The method of claim 7, further comprising spacing the plurality of grooves uniformly apart from one another.

12. The method of claim 7, further comprising disposing the plurality of conductive beam optics around an ion beamline.

13. A conductive beam optic of an electrostatic filter, the conductive beam optic comprising:
a first axial end opposite a second axial end;
a central section extending between the first axial end and the second axial end; and
a plurality of grooves formed in an exterior surface of the central section, wherein the plurality of grooves is arranged in a helical pattern along a length of the central section.

* * * * *